US011838346B2

(12) United States Patent
Yoon et al.

(10) Patent No.: US 11,838,346 B2
(45) Date of Patent: Dec. 5, 2023

(54) APPARATUS FOR LIGHT WEIGHTED SETTING SPATIAL DATA OF 3D MODELING DATA AND VIDEO MONITORING

(71) Applicant: PLUXITY CO. Ltd., Seoul (KR)

(72) Inventors: Jae Min Yoon, Seoul (KR); Sun Woo Kim, Seoul (KR)

(73) Assignee: PLUXITY CO. Ltd., Seoul (KR)

( * ) Notice: Subject to any disclaimer, the term of this patent is extended or adjusted under 35 U.S.C. 154(b) by 0 days.

(21) Appl. No.: 17/565,943

(22) Filed: Dec. 30, 2021

(65) Prior Publication Data

US 2022/0272137 A1    Aug. 25, 2022

(30) Foreign Application Priority Data

Feb. 24, 2021  (KR) .................. 10-2021-0024822

(51) Int. Cl.
*G06F 15/16*    (2006.01)
*H04L 65/65*    (2022.01)
*G06T 17/10*    (2006.01)
*G06F 30/13*    (2020.01)
*H04L 67/02*    (2022.01)
*H04L 65/75*    (2022.01)

(52) U.S. Cl.
CPC .............. *H04L 65/65* (2022.05); *G06F 30/13* (2020.01); *G06T 17/10* (2013.01); *H04L 65/75* (2022.05); *H04L 67/02* (2013.01)

(58) Field of Classification Search
CPC ............................ G06Q 50/10; H04N 21/274
See application file for complete search history.

(56) References Cited

U.S. PATENT DOCUMENTS

2015/0161818 A1*  6/2015  Komenczi ............ H04N 13/296
                                                                    348/43
2017/0201563 A1*  7/2017  Wang ...................... H04L 65/65

FOREIGN PATENT DOCUMENTS

KR    10-2020-0086561 A    7/2020

* cited by examiner

*Primary Examiner* — Yves Dalencourt
(74) *Attorney, Agent, or Firm* — Knobbe, Martens, Olson & Bear, LLP

(57) ABSTRACT

A method of setting spatial information for defining a space in the shape of dimensional data or property information including relationship information between objects installed in the space is defined, and a video monitoring apparatus is set to be linked to the defined method. Then, based on the same, a video captured by a video monitoring apparatus provided in a space may be efficiently output on the web. Therefore, various functions may be performed in which 3-dimensional spatial information and video monitoring are linked in a very easy way.

10 Claims, 9 Drawing Sheets

APPARATUS FOR LIGHT WEIGHTED SETTING SPATIAL DATA OF 3D MODELING DATA AND VIDEO MONITORING

CROSS-REFERENCE TO RELATED APPLICATION

This application claims the benefit of Korean Patent Application No. 10-2021-0024822, filed on Feb. 24, 2021, in the Korean Intellectual Property Office, the disclosure of which is incorporated herein in its entirety by reference.

BACKGROUND

Technical Field

The present disclosure relates to a technique for implementing 3-dimensional spatial information and a video monitoring system for a CCTV installed in a space on the web, and more particularly, to a technique for defining a method of setting spatial information capable of defining a space in the shape of dimensional data or property information including relationship information between objects installed in the space, and linking a video monitoring apparatus to the defined method, such that, based on the same, a video captured by a video monitoring apparatus provided in a space may be efficiently output on the web. Here, spatial information is defined in a very easy way to precisely determine property information regarding 3-dimensional data, and various video monitoring system may be established by utilizing the same.

Description of Related Technology

A video monitoring system is a technology widely used in smart cities and the like nowadays, and is widely used especially for purposes like indoor and outdoor safety management and accident response. A video monitoring system is a system including a video monitoring apparatus like a CCTV that is installed in a certain space on a site and captures a video, a monitoring server that manages videos captured by the video monitoring apparatus, and a terminal that obtains and utilizes videos from the monitoring server.

SUMMARY

Provided is a new method of defining spatial information for processing a specific space into 3-dimensional data by using a digital twin and provides a technique for efficiently linking a video monitoring apparatus to the method to be universally applicable to conventional video monitoring apparatuses using various protocols (e.g., CCTVs). In particular, the present disclosure provides a technique that enables universal monitoring of videos of an indoor space without establishing a separate dedicated system therefor by using the video monitoring apparatuses with light-weighted data on the web.

The present disclosure also provides a technique for using a video monitoring system on the web to perform various functions.

Additional aspects will be set forth in part in the description which follows and, in part, will be apparent from the description, or may be learned by practice of the presented embodiments.

According to an aspect of the present disclosure, an apparatus for setting spatial information and monitoring a video for light-weighted 3-dimensional modeling data, implemented by a computing apparatus including one or more processors and one or more memories storing instructions executable on the one or more processors, the apparatus includes a spatial information setting unit configured to use, as data input from the outside, modeling data regarding objects and spaces obtained through 3-dimensionally modeling of the objects included in the spaces, relationship information regarding connection relationship between the objects, and property information regarding the objects to perform a function of setting spatial information for modeling data regarding the spaces and the objects included in the spaces by setting shapes of the spaces formed by the objects, property information regarding the spaces, and connection information between the spaces; a video monitoring requesting unit configured to, when a selection for one piece of spatial information is received from a user terminal as a request for connection between spatial information and a video monitoring apparatus, select a video object corresponding to the video monitoring apparatus from among objects set to a key value identical to a key assigned to the one piece of spatial information and transmit a video streaming start requesting signal to a selected video object; and a video playback unit configured to, when video data is received from a video object to which a video streaming start requesting signal is transmitted by the video monitoring requesting unit, process the video data to be matched to a video playback protocol in a user interface of the user terminal executing a video streaming and transmit processed video data to the user terminal.

The video playback unit may use different video connection methods according to a protocol of connection equipment connecting between the video monitoring apparatus corresponding to the video object and the video playback unit, when the protocol is HTTP, received video data may be directly output to a user interface executed on the web, and, when the protocol is a protocol set for each video monitoring apparatus other than HTTP, a first intermediate player, which is installed between the video playback unit and the video object and a playback program dedicated for video data is executed thereon, may be further provided, and the video playback unit may perform a first method of transmitting video streaming data, which is operational on a user interface and generated as the first intermediate player plays back video data, to the user terminal to output the video streaming data on a user interface executed on the user terminal, and a second intermediate player, which is installed between the video playback unit and the video object and converts RTSP streaming to the form of a web socket, may be further provided, and the video playback unit may perform a second method of transmitting a video by opening a web socket port to the user terminal that attempts to connect through a user interface on the second intermediate player.

The spatial information setting unit may include a first spatial information setting unit configured to, when modeling data, which is data input from the outside for defining an outer shape of an object through 3-dimensional modeling of the object, is received, define first spatial information, which defines a shape of a space formed by at least one object, based on a shape of modeling; a connection information setting unit configured to set node data corresponding to a center point of each space by using the first spatial information and setting connection information including link data, which represents connection relationships between node data, by using input data, which is received from the outside and is related to connection relationships between node data; a second spatial information setting unit configured to set second spatial information that defines property information regarding a space formed by objects by using property information for the objects input from the outside; and a spatial information setting completing unit configured to link the first spatial information, the second spatial information, and the connection information for each space, thereby setting spatial information regarding modeling data of each space and each object included in each space.

The first spatial information may include at least one of first detailed data that defines the shape of each space in the form of light-weighted data, second detailed data for distinguishing whether each space relates to an outdoor space or an indoor space, and third detailed data for distinguishing the type of a space formed by objects based on the modeling shape of each object.

When the modeling data is received, the first spatial information setting unit may generate light-weighted frame data capable of defining an outer shape of each space based on the modeling data, sets regions of a space by using geometry drawn on a floor surface of the space formed by objects for each frame data, and, when the space formed by the objects is an indoor space, define a height of the space by using modeling data regarding the objects.

The second spatial information may include at least one of a name of a space, a purpose of the space, a type of the space, the geometry constituting the space, information for distinguishing whether the space is an indoor space or an outdoor space, drawing data regarding the space, and detailed architectural information regarding the space.

The spatial information setting completing unit may automatically set spatial information including the key value regarding the video object as spatial information for a space to which the video object belongs.

When the video object plays back through a user interface, the video playback unit may extract spatial information having a key value identical to the key value of the video object and output the spatial information to a user interface and, when there is a history of a change of a video object that generated video data output to the user interface, may output information regarding a change of history of spatial information, which is generated as the video object is changed, to the user interface.

Based on the modeling data, a center point of a space formed by objects may be defined as node data regarding the space formed by the objects and the objects when the objects are objects constituting an outer shape and an internal space of a building, centers of objects may be defined as node data regarding the objects when the objects are objects interconnecting spaces, and points of intersection of link data interconnecting the node data may be defined as node data regarding a path space interconnecting the spaces.

When setting spatial information for the video object, the spatial information setting unit may set spatial information by including connection information regarding a video monitoring apparatus corresponding to the video object from among information included in the property information regarding video monitoring apparatuses, which is input from the outside, in the spatial information regarding the video object as information for selecting the video object and requesting the selected video object to transmit video data when the video monitoring requesting unit selects any one key value.

BRIEF DESCRIPTION OF THE DRAWINGS

These and/or other aspects will become apparent and more readily appreciated from the following description of the embodiments, taken in conjunction with the accompanying drawings.

DETAILED DESCRIPTION

Figure 1:
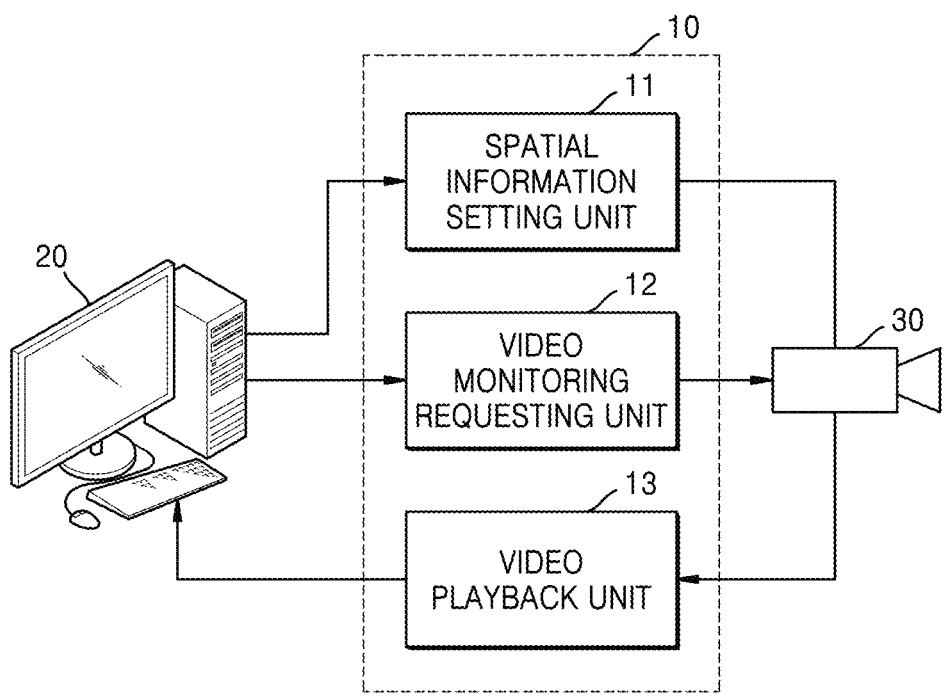
FIG. 1 is a block diagram showing the configuration of an apparatus for setting spatial information and monitoring video for light-weighted 3-dimensional modeling data according to an embodiment of the present disclosure.

A video monitoring system may be implemented only when a specialized monitoring server is established due to the characteristics that video data is processed according to protocols different from one video monitoring apparatus to another and problems like network traffic due to streaming of video data.

For example, Korean Patent Laid-Open Publication No. 10-2020-0086561 discloses a technique for linking a 3-dimensional monitoring system and videos from a camera like a CCTV in a subway station space. In the publication reference, a plurality of cameras installed in a subway station are mapped to their locations and stored, and videos of the corresponding cameras may be streamed or, when an event like a fire is detected, a notification of the corresponding event may be provided.

However, as described above, a video monitoring system using previous CCTVs, is implemented by a system that maps locations of CCTVs on a specific 3-dimensional drawing and simply outputs videos of mapped CCTVs. However, as described above, such a video monitoring system is not adaptive to various protocols for video data, and network traffic for streaming video data and a cost for establishing a dedicated network are excessive.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, various embodiments and/or aspects are disclosed with reference to the drawings. In the following description, for purposes of explanation, numerous specific details are disclosed to provide a thorough understanding of one or more aspects. However, it will also be understood by one of ordinary skill in the art that such aspect(s) may be practiced without these specific details. The following description and accompanying drawings disclose in detail certain illustrative aspects of one or more aspects. These aspects are illustrative, however, and some of various methods may be employed in the principles of the various aspects. Also, the descriptions disclosed below are intended to include all such aspects and their equivalents.

As used herein, "embodiment", "example", "aspect", etc. may not be construed as advantageous or advantageous over any other aspects, aspects with different designs, or designs described herein.

Also, the terms "comprises" and/or "comprising" mean that a corresponding feature and/or element is present, but it should be understood that the presence or addition of one or more other features, elements and/or groups thereof are not excluded.

Also, while such terms as "first," "second," etc., may be used to describe various components, such components must not be limited to the above terms. The above terms may be used only to distinguish one element from another. For example, without departing from the scope of the inventive concept, a first element may be referred to as a second element, and similarly, a second element may also be referred to as a first element. The term "and/or" includes a combination of a plurality of related listed items or any of a plurality of related listed items.

In addition, in the embodiments of the present disclosure, unless otherwise defined, all terms used herein, including technical or scientific terms, have the same meanings as those commonly understood by one of ordinary skill in the art to which the present disclosure belongs. Terms identical to those defined in commonly used dictionaries should be interpreted as having a meaning consistent with the meaning in the context of the related art and are not to be interpreted as ideal or overly formal in meaning unless explicitly defined in embodiments of the present disclosure.

Figure 2:
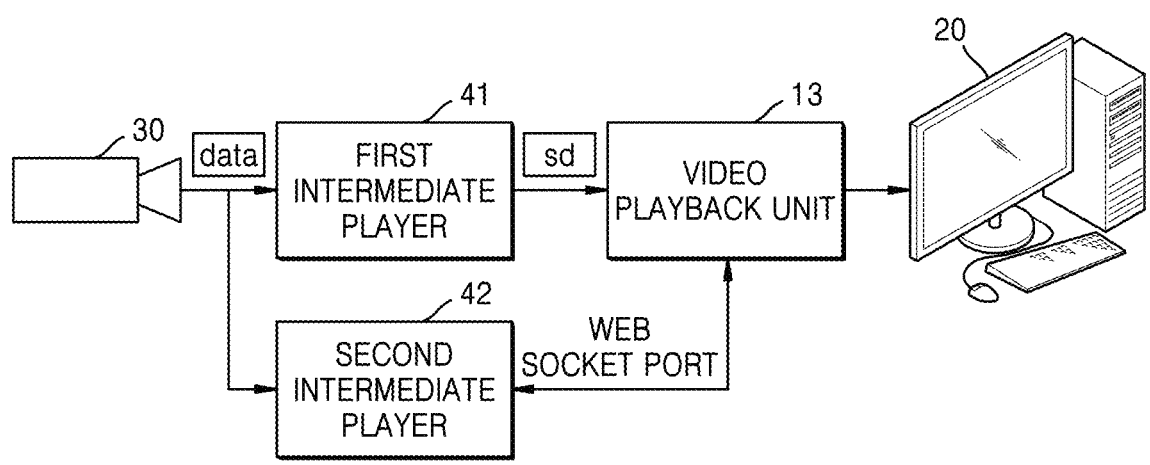
FIG. 2 is a diagram showing an example of a flow in which video data is processed according to the implementation of an embodiment of the present disclosure.
Figure 3:
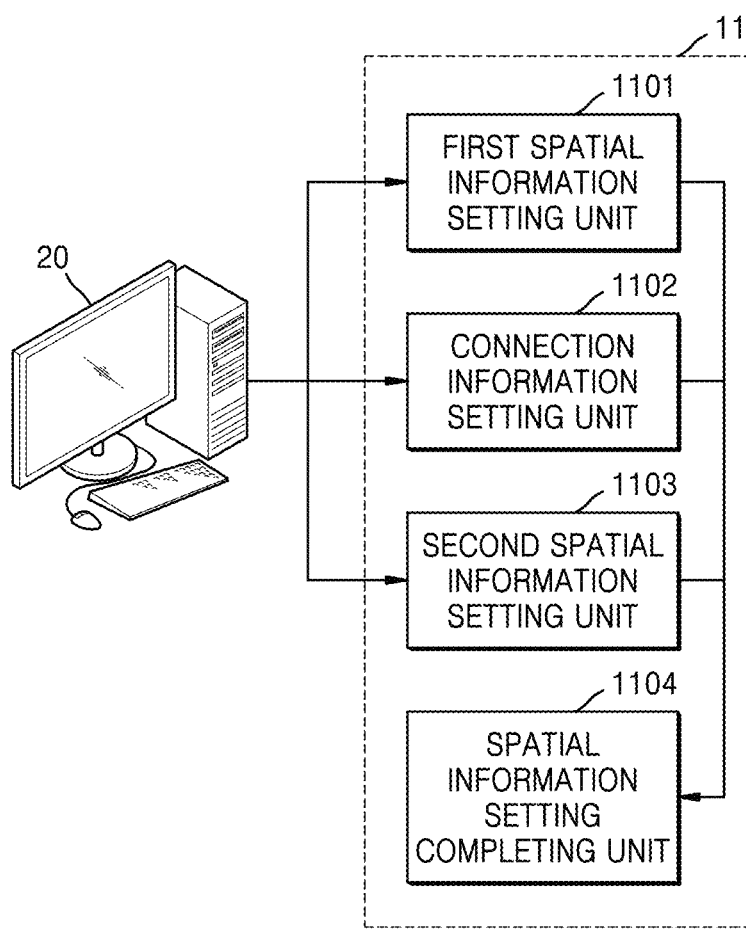
FIG. 3 is a diagram showing the configuration of a spatial information setting unit according to an embodiment of the present disclosure in detail.
Figure 4:
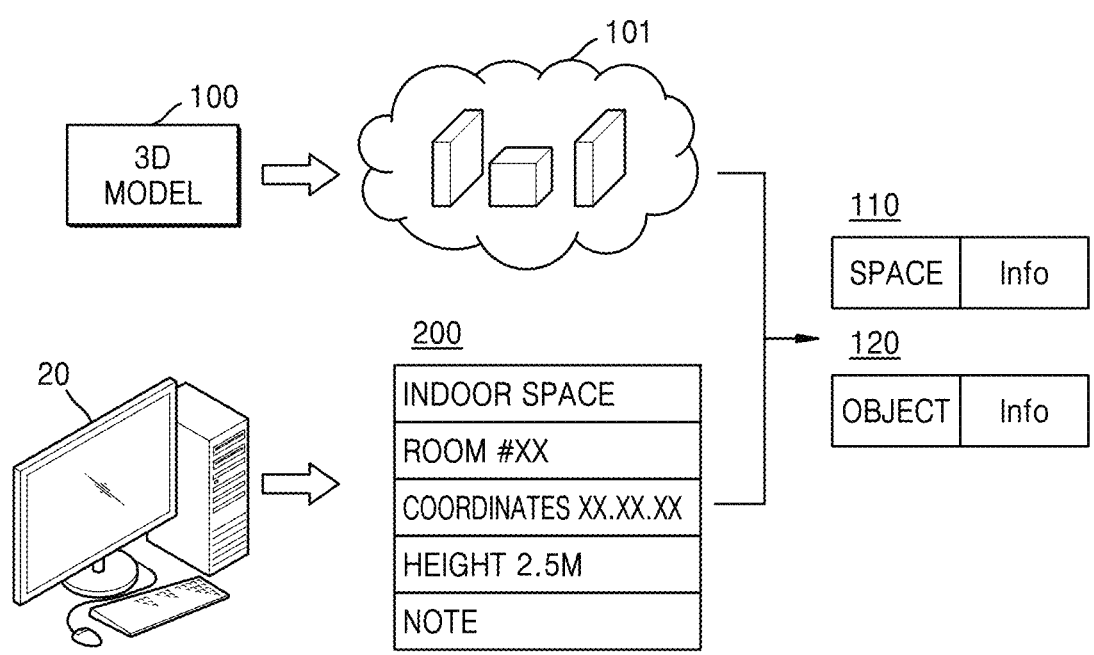
FIG. 4 is a diagram for describing an example in which spatial information is generated according to the implementation of an embodiment of the present disclosure.
Figure 5:
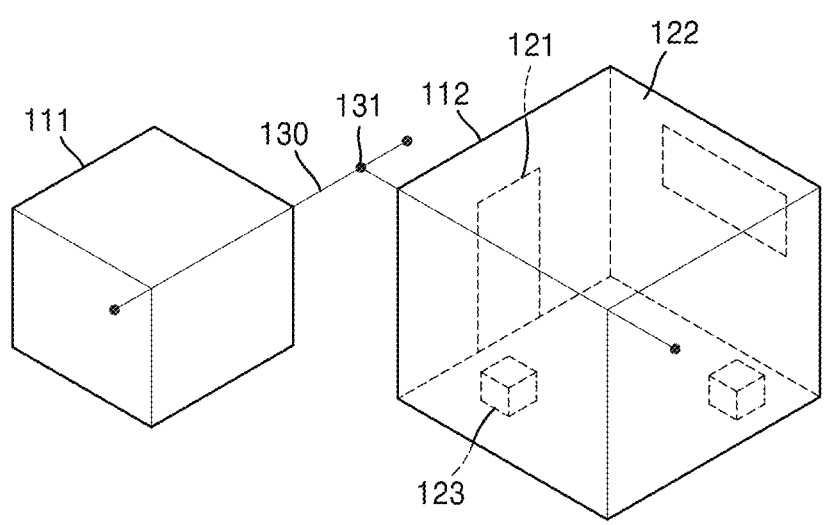
FIGS. 5 to 7 are diagrams for describing examples in which spaces, nodes, and link data are set according to the implementation of an embodiment of the present disclosure.
Figure 6:
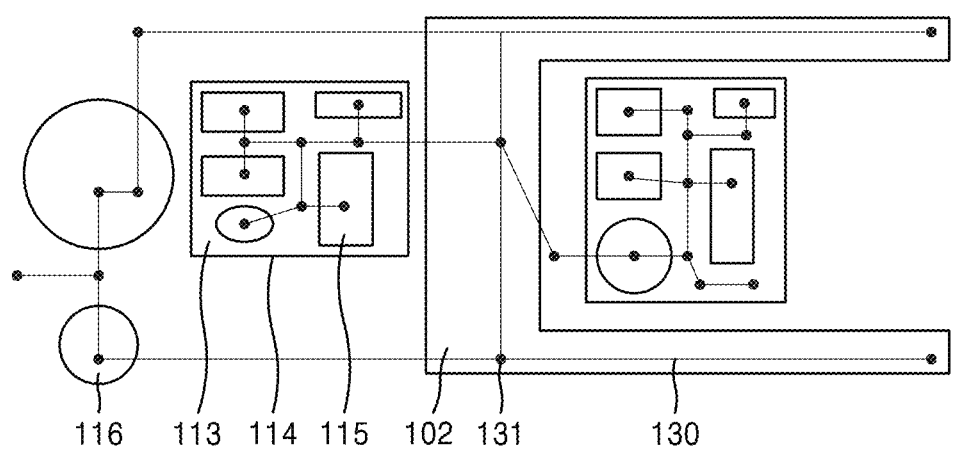
Figure 7:
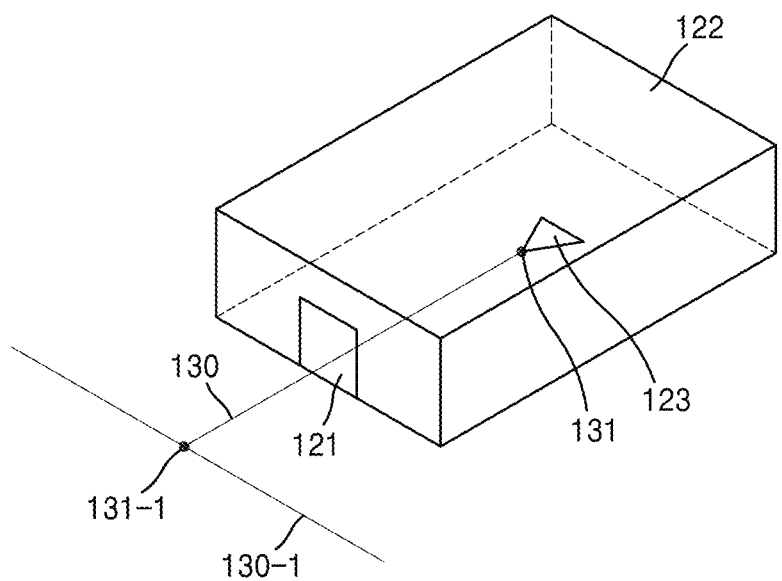
Figure 8:
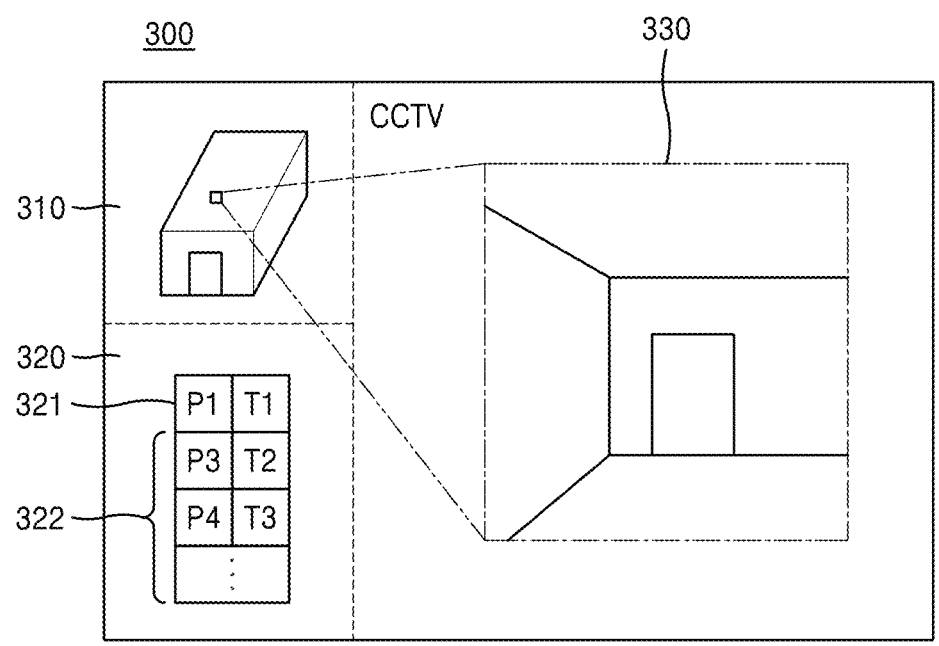
FIG. 8 is a diagram showing an example of a user interface screen image displayed on a user terminal according to the implementation of an embodiment of the present disclosure.

FIG. 1 is a block diagram showing the configuration of an apparatus for setting spatial information and monitoring video for light-weighted 3-dimensional modeling data according to an embodiment of the present disclosure, FIG. 2 is a diagram showing an example of a flow in which video data is processed according to the implementation of an embodiment of the present disclosure, FIG. 3 is a diagram showing the configuration of a spatial information setting unit according to an embodiment of the present disclosure in detail, FIG. 4 is a diagram for describing an example in which spatial information is generated according to the implementation of an embodiment of the present disclosure, FIGS. 5 to 7 are diagrams for describing examples in which spaces, nodes, and link data are set according to the implementation of an embodiment of the present disclosure, and FIG. 8 is a diagram showing an example of a user interface screen image displayed on a user terminal according to the implementation of an embodiment of the present disclosure. The above-described drawings will be selectively referred to for describing embodiments of the present disclosure and the functional implementations of components.

Before describing with reference to the above-stated drawings, it will be understood that an apparatus 10 for setting spatial information and monitoring video for light-weighted 3-dimensional modeling data according to an embodiment of the present disclosure (hereinafter referred to as an apparatus of the present disclosure) is implemented to be included in a computing apparatus shown in FIG. 9 or implemented to include a plurality of computing apparatuses according to components and functions thereof. In the present disclosure, the computing apparatus may be understood as a concept including all terminals capable of processing, storing, managing, outputting, and inputting data, e.g., personal computers, server terminals, database management terminals, portable computers, laptop computers, smart pads, smart phones, etc.

Also, the computing apparatus may refer to a functional apparatus equivalent to or included in a plurality of terminals capable of using the functions of setting spatial information and monitoring video for light-weighted 3-dimensional modeling data in conjunction with the apparatus 10 of the present disclosure.

In detail, the apparatus 10 of the present disclosure includes a spatial information setting unit (or a spatial information setting processor) 11, a video monitoring requesting unit (or a video monitoring requesting processor) 12, and a video playback unit (or a video playback processor) 13. Additionally, the apparatus 10 of the present disclosure may further include at least one of a first intermediate player 41 and a second intermediate player 42 installed between the video playback unit 13 and a video monitoring apparatus 30.

The spatial information setting unit 11 uses, as data input from the outside, modeling data regarding objects and spaces obtained through 3-dimensionally modeling of the objects included in the spaces, relationship information regarding connection relationship between the objects, and property data regarding the objects to perform the function of setting spatial information for modeling data regarding the spaces and the objects included in the spaces by setting shapes of the spaces formed by the objects, property data regarding the spaces, and connection information between the spaces.

In the present disclosure, data input from the outside means data input from all terminals that generate and provide specific data including a user terminal 20 and other terminals. For example, the user terminal 20 may be a manager terminal regarding 3D modeling data that generates modeling data, and the manager terminal may include not only the user terminal 20, but also a terminal used by an external subject of performing 3-dimensional modeling. Also, all terminals including the user terminal 20 are used by a subject which manages all data for setting spatial information, such as relationship information regarding connection relationships between objects and property data. Also, corresponding data is input from all terminals including the user terminal 20.

In detail, instead of previous high-capacity spatial information, the spatial information setting unit 11 performs the function of easily and light-weightedly managing spatial information for 3-dimensional modeling data based on objects constituting spaces, connection relationships between the objects, connection relationships between the spaces, and light-weighted property data regarding the spaces and is a component functioning to perform the overall function of the apparatus 10 of the present disclosure. A detailed example thereof is shown in FIG. 3.

Referring to FIG. 3, the spatial information setting unit 11 according to an embodiment of the present disclosure includes a first spatial information setting unit 1101 that, when modeling data, which is data input from the outside and is capable of defining the outer appearance of an object through 3-dimensional modeling on the object, is received, sets first spatial information, which defines the shape of a space formed by at least one object based on a modeling shape, to the modeling data.

In the present disclosure, data being input from the outside means that, as described above, data for performing the function of the present disclosure is input from external terminals which are connected to a terminal for generating and/or managing 3-dimensional modeling data (e.g., a manager (user) terminal including the user terminal 20 via a network or a hardware connection and is capable of transmitting and receiving data through a wired/wireless network line.

In the present disclosure, an object refers to a unit constituting an indoor/outdoor space. For example, an object may include units constituting a certain space, such as an indoor wall, a ceiling, a door, a window, an outdoor building wall, an establishment, etc. 3-dimensional modeling data for an object is data generated by a computing apparatus based on a drawing of the object or numerical values and/or visual data (e.g., a photographed image, a video, etc.) obtained through actual measurement of the object and may include, for example, polygon data that 3-dimensionally representing the object.

In the present disclosure, targets including the object for which 3-dimensional spatial information is set refers to all spaces that may be 3-dimensionally implemented, and there is limit on space targets as long as things that may be created through modeling techniques are not limited. 3-dimensional spatial information may be created through a 3D modeling tool based on the design (drawing data used for architectural design including a plan view, an elevation view, a sectional view, etc.) of a target (space) that actually exists. As an occasion demands, additional data may be collected through on-site inspections. In other words, modeling data may be created based on drawings. However, when there is data provided through scanning or actual measurement, the data may be corrected and used to create modeling data.

When the first spatial information setting unit 1101 receives the above-stated modeling data, the first spatial information setting unit 1101 defines first spatial information, which defines the shape of a space formed by at least one object, for the space or objects included in the space based on the shape of modeling that may be determined from the modeling data and sets the first spatial information to the modeling data.

At this time, various detailed data defining the shape of the above-stated space may be defined in the first spatial information. For example, the first spatial information may include at least one of first detailed data that defines the shape of each space in the form of light-weighted data, second detailed data for distinguishing whether each space relates to an outdoor space or an indoor space, and third detailed data for distinguishing the type of a space formed by objects based on the modeling shape of each object.

For example, the shape of a space may be defined 3-dimensionally or 2-dimensionally by using only the outer boundary of a space that is defined as an object constitutes the space instead of detailed modeling data of the object. In other words, the first detailed data may be defined as, for example, data regarding the boundary of a space formed by objects as the outer shape of the space is limited by the objects.

The second detailed data may be defined as follows. Defining the second detailed data may be easily misunderstood as a method of authoring only indoor spatial information, but it is not only for indoor/outdoor-based modeling data, but the modeling shape is used as described above. Therefore, the method may be used regardless of indoor/outdoor as long as the second detailed data has a concept attribute for distinguishing indoor and outdoor. The second detailed data may be set based on a drawing or an input from the outside.

The third detailed data refers to data for identifying the type of a space formed by objects based on a modeling shape, e.g., a room, a bathroom, an elevator, a door, and a passage. For example, a door may be identified as a door based on the shape thereof, a portion having a shape close to a square or other shapes and surrounded by walls may be identified as a room, and a portion connected to a plurality of doors and having a long shape or a branched shape may be identified as a passage.

In other words, when first to third detailed data are defined during performance of the function of the first spatial information setting unit 1101, the shape of a space is extracted based on a floor through an object in which a wall, a story, a floor, and a ceiling may be identified through modeling data. In this case, it is important to identify walls, and the shape of a space is extracted based on center lines of walls or by distinguishing inner walls and outer walls of the walls. For example, in the case of a closed shape formed by walls, as described above, the shape may be recognized as an indoor space like a room and may express the interior of a building.

The first to third detailed data for identifying spatial information for each space or defining the spatial information as light-weighted data may be defined, for example, according to particular processes as described below.

First, when the first spatial information setting unit 1101 receives modeling data, the first spatial information setting unit 1101 generates light-weighted frame data that may define the outer shape of each space based on the modeling data. Referring to FIGS. 5 to 7, according to the present disclosure, when modeling data is received, first spatial information is set by editing the content of the modeling data.

First, in generating frame data, based on a method of modeling or drawing based on modeling as a basic mode, an approximate shape of an outer shape is drawn along a drawing. In this case, frame data including objects 121, 122, and 123, outer shapes 111 and 112 of a space, and a boundary line 114 defining the outer shape 111 and 112 of spaces may be defined.

Thereafter, for each frame data, the first spatial information setting unit 1101 sets regions of spaces by using geometry drawn by using floor surfaces of the spaces formed by objects. In defining data for an indoor space and an outdoor space, a floor surface of each space may be set as the bottommost boundary of each space. Therefore, based on a drawing, when detailed geometry of spatial information are needed for setting regions of a space in frame data, the space may be expressed by using a drawing method. Otherwise, a space may be defined as a conceptual space using very simple and light-weighted data like rectangles and circles.

At this time, since regions of a space are set based on a drawing, the regions of the space may be determined according to geometry drawn on the floor surface. Referring to FIG. 6, inside the boundary line 114 indicating each building space, spaces 113 and 116 that indicate non-room spaces for a specific purpose (e.g., a lobby, a common space, etc.) and are defined as circles, a room space 115 that indicate a room and defined as a rectangle, and a space 102 indicating a passage are set as regions of a space.

Thereafter, when a space formed by objects is an indoor space, the height of the space is defined by using modeling data of the objects. For example, by applying a shape that protrudes from the floor surface to the ceiling based on the height of an indoor story, the height of a 3-dimensional space is determined. In the case of an outdoor space, when only the concept of a space is needed (e.g., a garden), it is not necessary to determine the height of the outdoor space, but the height may be designated.

According to a result of performing the function of the first spatial information setting unit 1101 defined as described above, a connection information setting unit 1102 uses defined first spatial information to establish a node data corresponding to a center point for each space and performs the function of setting connection information including link data, which represents connection relationships between node data, by using input data, which is related to connection relationships between the node data and received from the outside.

In the present disclosure, node data is data for representing the center of each space or objects constituting the space (to be precise, objects that need to be defined separately from a space from among objects), and link data may be understood as data for representing connection relationships between node data. In other words, the node data and the link data are data for expressing spaces and influences and connections between the spaces by using very light-weighted data.

To describe a specific example with reference to FIGS. 5 to 7, first, when modeling data shows that objects constitute the outer shape of a building and an internal space, the center of the floor surface of a space (e.g., a room) formed by the objects is defined as node data 131 of the space formed by the objects and objects.

On the other hand, when objects are objects (i.e., doors) interconnecting spaces, the center of each object is defined as node data of the object, and an intersection point 131 of link data 130 and 130-1 interconnecting the respective node data are defined as node data for path spaces interconnecting the respective spaces.

In other words, connection points between nodes and links may be found based on a door or an entrance element that may be passed through on modeling. The center point of a space constructed in this way may be created as a reference point of nodes, and, through the center of a room and the center of a door, nodes of spaces and important objects may be configured.

As defined in this way, a relationship between spaces may be conveniently checked through node data and link data. In this case, correlation and topological relationships may be determined only when nodes are arranged in a space, and information regarding a space where nodes are not arranged needs to be independently determined. Also, data information may be managed, such that node data connected to link data may be searched for through the link data.

A second spatial information setting unit 1103 defines more detailed property information for each space. In other words, the second spatial information setting unit 1103 performs the function of setting second spatial information that defines property information of a space formed by objects by using property information regarding the objects input from the outside.

In the present disclosure, the second spatial information is a concept that defines specific properties of a space and may include, for example, at least one of the name of a space, the purpose of the space, the type of the space, the geometry constituting the space, information for distinguishing whether the space is an indoor space or an outdoor space, drawing data regarding the space, and detailed architectural information regarding the space.

When needed, modeling information corresponding to a space and detailed architectural information like building information modeling (BIM) may be used. However, the BIM may be very large and complex, and the characteristics of the BIM are incompatible with the purpose of the present disclosure. Therefore, it may be configured, such that all or a part of information included in a BIM or the like may be selectively used when the information is input from the outside.

A spatial information setting completing unit 1104 links spatial information including the first spatial information, the connection information, the second spatial information, etc. collected by the above-described function to one another for each space, thereby performing the function of setting spatial information for modeling data of spaces and objects included in the spaces.

In other words, as shown in FIG. 4, spatial information 110 for respective spaces and spatial information 120 for specific objects are set by, for example, deriving first spatial information and connection information from 3-dimensional modeling data 100 through modeling data 101 for objects and setting second spatial information through data 200 input from user terminals 20.

According to the process, when spatial information is set based on information input from the outside, e.g., a manager terminal 20, spatial information for all indoor/outdoor spaces may be defined by defining node data designating respective spaces and link data defining connection relationships between the respective spaces, based on property information for identifying spaces formed by objects.

In other words, instead of complex data, spatial information may be very easily and precisely set based on data defined by property information of spaces formed by objects, nodes, and links, and thus light-weighted spatial information may be very easily set as compared to the previous techniques.

Meanwhile, in the above description, it has been stated in the description of FIG. 4 that separate spatial information 120 is set for a specific object. In the present disclosure, such a specific object is defined as a specific object like a point of interest (POI). At this time, when specific object data, which is information regarding a specific object in each space, is included in data for setting spatial information received from the outside, the spatial information setting completing unit 1104 automatically sets spatial information regarding a space corresponding to the specific object data as spatial information for the specific object data.

Such a specific object corresponds to an object denoted by 123 in FIGS. 5 to 6, which may be used as independently usable positional information even when the specific object does not belong to a space. However, a POI provided in a space is considered as a POI influencing the space. For example, the POI is a specific object that shows a connection position and property of a sensor or equipment indicating an event and belongs to a specific space. The POI is a concept including the video monitoring apparatus 30, which is a core component of the present disclosure, to be described later. It may be configured that, when a space is related to another space by a node or a link, other spaces related to a POI may be searched for through the POI, and POIs of other spaces may be searched for.

As described above, spatial information, node data, and link data may be set to have unique identification information (ID) not overlapping one another for management thereof. For example, when a room is configured in the form of modeling and the room is divided into several spaces, the ID of the room may not be duplicated and the spaces need to be identified independently.

As described above, after spatial information is set for spaces or objects like specific objects, various external terminals may utilize the spatial information for various purposes. In addition to the function for monitoring videos to be described later, the spatial information setting unit 11 may also perform the function of generating event prediction data, which is data predicting an effect at the time of an event that influences a space, by using the spatial information according to a request from the outside.

At this time, generated event prediction data may include, for example, objects that are in a space at the time of an event and influenced by the event when the event occurs, the range of the influence between the objects, a path of dispersion of a possible situation when the event occurs based on a phase relationship between the objects, and quantitative values regarding the influence of the event to each space based on property information regarding objects included in the corresponding space, etc.

As described above, data that is highly light-weighted and optimized for a purpose like event prediction is managed as spatial information, as compared to previous techniques, modeling data and spatial information may be utilized for general-purpose utilization of spatial information for energy management, city monitoring, fire and disaster responses, etc.

When light-weighted spatial information for 3-dimensional modeling data is set according to the performance of the function of the spatial information setting unit 11 as described above and a selection for one piece of spatial information is received from the user terminal 20 as a request for connection between spatial information and the video monitoring apparatus 30, the video monitoring requesting unit 12 selects a video object corresponding to the video monitoring apparatus 30 from among objects set to the same key value as the key assigned to the one piece of spatial information and performs the function of transmitting a video streaming start requesting signal to the selected video object.

As described above, by performing the function of the spatial information setting unit 11, the video monitoring apparatus 30 are managed as specific objects or POIs, which are referred to as video objects to be distinguished from other specific objects.

Since a video object is also one of objects managed by the spatial information setting unit 11 described above, in the present disclosure, to manage data regarding video objects, the spatial information setting unit 11 may set a key value to each spatial information for identification, and a key value corresponding to spatial information may be assigned to each video object. In other words, to establish a DB of connection information of the video monitoring apparatus 30 collected by the spatial information setting unit 11 to manage data regarding video objects, a key value for linking with each spatial information may be set to each video monitoring apparatus 30.

Also, to provide a video to the user terminal 20 through a connection to a video object, when the spatial information setting unit 11 sets spatial information for the video object, the spatial information setting unit 11 performs the function of setting spatial information by including connection information regarding the video monitoring apparatus 30 corresponding to the video object from among information included in the property information regarding video monitoring apparatuses 30, which is input from the outside, in the spatial information regarding the video object as information for selecting the video object and requesting the selected video object to transmit video data when the video monitoring requesting unit 12 selects any one key value.

In the present disclosure, property information regarding the video monitoring apparatus 30 is, for example, connection information regarding the video monitoring apparatus 30 and may include an IP address, a port, an ID, a password, a real time streaming protocol (RTSP) url information, etc.

Under such a setting, for example, it may be assumed that a web server in which the apparatus 10 of the present disclosure including the video playback unit 13 is implemented and the video monitoring apparatus 30 to be linked exist on the same network accessible by both, and it may be assumed that spatial information regarding respective spaces and connection information regarding video objects are established by the performance of the function of the spatial information setting unit 11.

At this time, in a state where a 3-dimensional model and spatial information are established, specific key values are assigned to respective spaces and nodes of objects as described above, and, through the key values, the video monitoring requesting unit 12 may transmit a connection for accessing a video object based on information established in a DB. In other words, a video streaming start requesting signal for a user to confirm a 3-dimensional space and select a POI, an object, or a node point represented as 3-dimensional spatial information through an input like a click or a touch for playback of a video of a corresponding point on a user interface described later is transmitted to a corresponding video object.

When video data is received from a video object to which a video streaming start requesting signal is transmitted by the video monitoring requesting unit 12, the video playback unit 13 performs the function of processing the video data to be matched to a video playback protocol in a user interface of the user terminal 20 executing a video streaming and transmitting processed video data to the user terminal 20 to visualize a video in the user interface.

In this case, according to the present disclosure, the function as shown in FIG. 2 and additional components may be provided to visualize a video regardless of the video monitoring apparatus 30 installed in advance.

In other words, the video playback unit 13 may use different video connection methods according to the protocol of connection equipment connecting between the video monitoring apparatus 30 corresponding to a video object and the video playback unit 13.

For example, when the above-stated protocol is HTTP, since a video may be reproduced directly on the web without using a particular player locally, received video data is directly output to a user interface executed on the web.

However, when the protocol is a protocol set for each video monitoring apparatus 30 other than HTTP, an additional component for visualizing the video data may be included. For example, when the protocol is the above-described RTSP protocol or the SDK protocol for each particular video monitoring apparatus 30, the above-stated protocols are not usable on the web, the first intermediate player 41 or the second intermediate player 42 is further included as an additional component between the video playback unit 13 and the video monitoring apparatus 30 (i.e., a video object) to enable video playback.

In detail, the first intermediate player 41 is a component installed between the video playback unit 13 and a video object and a playback program dedicated for video data is executed thereon. The video playback unit 13 may perform a first method of transmitting video streaming data, which may be operated on a user interface and generated as the first intermediate player 41 plays back video data, to the user terminal 20 to output the video streaming data on a user interface executed on the user terminal 20.

On the other hand, in detail, the second intermediate player 42 is installed between the video playback unit 13 and the video object and performs the function of converting RTSP streaming to the form of a web socket. Therefore, the video playback unit 13 may perform a second method of transmitting a video by opening a web socket port to the user terminal 20 that attempts to connect through a user interface on the second intermediate player 42. The video playback unit 13 selectively uses the first method or the second method described above, thereby visualizing a video on a user interface.

Therefore, as long as equipment for connection with a CCTV like an IP camera, an NVR, a DVR, and a VMS (i.e., the video monitoring apparatus 30) supports the RTSP protocol or the HTTP protocol, there is no limit in connection to the video monitoring apparatus 30. In other words, even a previously installed video monitoring apparatus 30 may become capable of performing the function of the present disclosure through establishment of a simple system and a DB as described above.

Meanwhile, when the video playback unit 13 starts video streaming, for example, in the case of the first intermediate player 41, the video playback unit 13 may transmit a signal to an agent for video connection on a web browser by using a Rest-api method, and the agent that received the signal may play back a video by invoking a particular player for video streaming of the video monitoring apparatus 30 corresponding to a corresponding space or may receive a video through an url in the HTTP format and visualize the video on a user interface through a tag of the web browser.

Through the linked operation between spatial information and the video monitoring apparatus 30, various video monitoring functions may be performed without separately establishing a complex video monitoring system.

For example, referring to a user interface screen image 300 of FIG. 8, on a basic user interface, users may check spatial information 310 and easily determine which space a currently played video 330 corresponds to.

Meanwhile, according to the present disclosure, the video playback unit 13 may manage history data 320. In other words, since a video object is managed as being linked to spatial information as described above, a time at which a corresponding video is captured or confirmed and the spatial information may be accurately matched to each other and managed by determining conjunctional information only.

In other words, when a video object plays back through a user interface as shown in the history data 320, the video playback unit 13 extracts spatial information having the same key value as a key value of the video object and outputs the spatial information on a user interface. In this case, when there is a history that a video object generated video data being displayed on the user interface has been changed, the video playback unit 13 may display information regarding a change of spatial information generated according to the change of the video object on the user interface.

In other words, as shown in the history data 320, in addition to current data 321 including a time T1 at which a current position P1 is monitored, as a history, previous data 322 including positions P3 and P4 monitored at previous times T2 and T3 may be output. Furthermore, various functions may be performed by using the same.

For example, when a particular accident or crime is recognized through the video monitoring apparatus 30, the video monitoring apparatus 30 may support playback to display the previous data 322 or track the path of an object to be tracked through link information. Alternatively, information regarding whether an accident has occurred and whether the accident has been properly handled may be confirmed, and an accident dispersion path prediction and accident path tracking may be performed through link information between spatial information regarding the accident. Therefore, a monitoring personnel may check positions regarding an actual space point through spatial information and utilize the positions (the spatial information?) for patrol and situational response.

Figure 9:
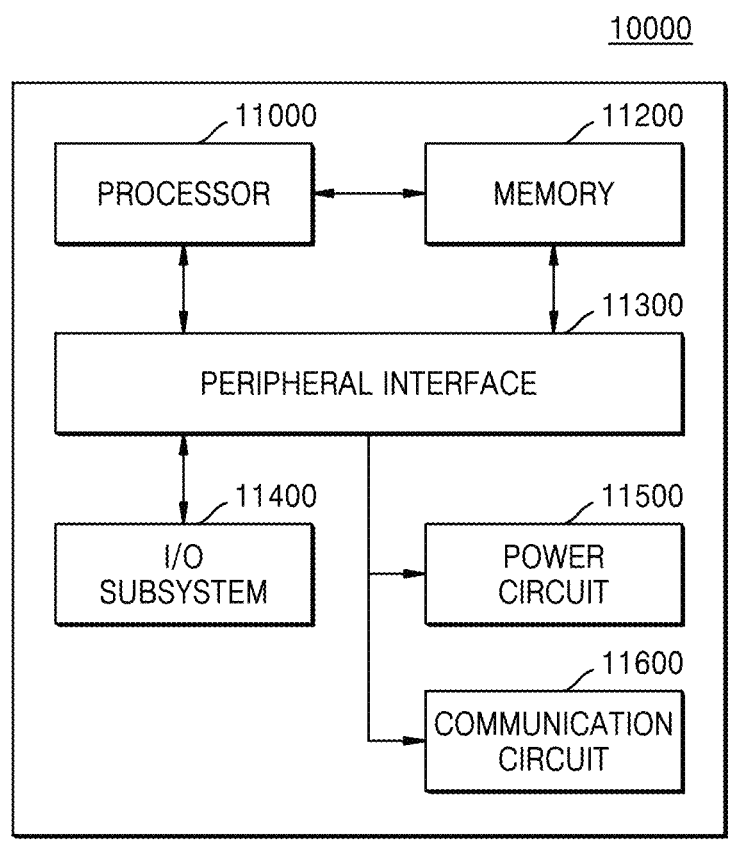
FIG. 9 is an example of an internal configuration of a computing apparatus according to an embodiment of the present disclosure.

FIG. 9 shows an example of the internal configuration of a computing apparatus according to an embodiment of the present disclosure. In the descriptions below, descriptions of unnecessary embodiments identical to those given above with reference to FIGS. 1 to 8 will be omitted.

As shown in FIG. 9, a computing apparatus 10000 includes at least one processor 11100, a memory 11200, a peripheral interface 11300, and input/output (I/O) subsystem 11400, a power circuit 11500, and a communication circuit 11600, at least. In this case, the computing apparatus 10000 may correspond to a user terminal A connected to a tactile interface device or the above-stated computing apparatus B.

The memory 11200 may include, for example, a high-speed random-access memory, a magnetic disk, an SRAM, a DRAM, a ROM, a flash memory, or a non-volatile memory. The memory 11200 may include a software module, an instruction set, or other various data needed for the operation of the computing apparatus 10000.

In this case, accesses to the memory 11200 from other components, such as the processor 11100 or the peripheral interface 11300 may be controlled by the processor 11100.

The peripheral interface 11300 may couple an input peripheral and/or an output peripheral of the computing apparatus 10000 to the processor 11100 and the memory 11200. The processor 11100 may execute a software module or an instruction set stored in the memory 11200 to perform various functions for the computing apparatus 10000 and process data.

The I/O subsystem 11400 may couple various input/output peripherals to the peripheral interface 11300. For example, the I/O subsystem 11400 may include a controller for coupling a peripheral device such as a monitor, a keyboard, a mouse, and a printer or, as needed, a peripheral like a touch screen or a sensor to the peripheral interface 11300. According to another aspect, input/output peripherals may be coupled to peripheral interface 11300 without interposing the I/O subsystem 11400 therebetween.

The power circuit 11500 may supply power to all or some of the components of a terminal. For example, the power circuit* 11500 may include a power management system, one or more power sources such as a battery or an alternating current (AC), a charging system, a power failure detection circuit, a power converter or an inverter, a power status indicator, or any other components for generating, managing, and distributing power.

The communication circuit 11600 may enable communication with another computing apparatus by using at least one external port.

Alternatively, as described above, as an occasion demands, the communication circuit 11600 may include an RF circuit to transmit and receive RF signals, which are also known as electromagnetic signals, to enable communication with another computing apparatus.

The embodiment of FIG. 9 is only an example of the computing apparatus 10000, and the computing apparatus 11000 may have configurations in which some components shown in FIG. 9 are omitted, additional components not shown in FIG. 9 are further provided, or two or more of the components are combined with each other. For example, a computing apparatus for a communication terminal in a mobile environment may further include a touch screen or a sensor in addition to the components shown in FIG. 9, and circuits for RF communications in various communication methods (e.g., WiFi, 3G, LTE, NFC, Zigbee, etc.) may be included in the communication circuit 11600. Components that may be included in the computing apparatus 10000 may each be implemented as hardware, software, or a combination of both hardware and software including one or more integrated circuits dedicated for signal processing or an application.

According to the present disclosure, when implementing a 3-dimensional virtual space for indoor and outdoor spaces by using an video monitoring apparatus on the web, spatial information may be very easily and clearly set for a space and objects constituting or installed in the space through data defined as property information regarding the space to which the objects belong, nodes, and links, and video monitoring apparatuses are managed in conjunction with set spatial information. Therefore, a method of managing very easy and light-weighted spatial information and a video monitoring system using the same may be established.

Also, video data may be checked on the web regardless of a protocol of a video monitoring apparatus, thereby enabling general-purpose monitoring of indoor/outdoor videos on the web without establishing a separate system.

On the other hand, there is an effect of facilitating implementation of a video monitoring function that requires establishment of very complex system, e.g., object tracking and accident response, through management of spatial information in conjunction with videos.

The methods according to embodiments of the present disclosure may be implemented in the form of program instructions that may be executed through various computing apparatuses and recorded on a computer-readable recording medium. In particular, a program according to the present embodiment may be configured as a PC-based program or an application dedicated to a mobile terminal. An application to which the present disclosure is applied may be installed on a user terminal through a file provided by a file distribution system. For example, the file distribution system may include a file transmission unit (not shown) that transmits the file in response to a request from the user terminal.

The apparatus described above may be implemented as a hardware component, a software component, and/or a combination of a hardware component and a software component. For example, apparatuses and components described in the embodiments may be implemented by using one or more general-purpose computers or special-purpose computers, e.g., a processor, a controller, an arithmetic logic unit (ALU), a digital signal processor, a microcomputer, a field programmable gate array (FPGA), a programmable logic unit (PLU), a microprocessor, or any other device capable of executing and responding to instructions. A processing apparatus may execute an operating system (OS) and one or more software applications running on the OS. Also, the processing device may access, store, manipulate, process, and generate data in response to execution of software. Although some of the descriptions above have been given that one processing apparatus is used for convenience of understanding, one of ordinary skill in the art will understand that the processing apparatus may include a plurality of processing elements and/or a plurality of types of processing elements. For example, a processing apparatus may include a plurality of processors or one processor and one controller. Also, other processing configurations like parallel processors may also be implemented.

The software may include a computer program, code, instructions, or a combination of one or more of the foregoing, to configure the processing device to operate as demanded or to command the processing device independently or collectively. Software and/or data may be permanently or temporarily embodied on a certain type of machine, a component, physical equipment, virtual equipment, a computer storage medium, or an apparatus to be interpreted by a processing apparatus or to provide instructions or data to the processing apparatus. Software may be distributed over computing apparatuses connected to one another via a network and stored or executed in a distributed manner. The software and data may be stored on one or more computer-readable recording media.

Methods according to embodiments may be implemented in the form of program instructions that may be executed through various computer means and recorded on a computer-readable recording medium. The computer-readable recording medium may include program instructions, data files, data structures, etc. alone or in combination. The program commands recorded on the medium may be specially designed and configured for example embodiments or may be published and available to one of ordinary skill in computer software. Examples of the computer-readable recording medium include a hardware device specially configured to store and perform program instructions, for example, a magnetic medium, such as a hard disk, a floppy disk, and a magnetic tape, an optical recording medium, such as a CD-ROM, a DVD, and the like, a magneto-optical medium, such as a floptical disc, ROM, RAM, a flash memory, and the like. Examples of program commands include machine language code such as code generated by a compiler, as well as high-level language code that may be executed by a computer using an interpreter or the like. The hardware apparatus described above may be configured to operate as one or more software modules to perform the operations of the embodiments, and vice versa.

As described above, although the embodiments have been described with reference to limited embodiments and drawings, various modifications and variations may be made therein from the above description by one of ordinary skill in the art. For example, an appropriate result may still be achieved even when the techniques described above are performed in an order different from that described above and/or when the system, the structure, the apparatus, and the components like circuits are coupled or combined with one another in a manner different from that described above or replaced or substituted by other components or equivalents. Therefore, other implementations, other embodiments, and equivalents of the claims also fall within the scope of the following claims.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. An apparatus for setting spatial information and monitoring a video for light-weighted 3-dimensional modeling data, implemented by a computing apparatus comprising one or more processors and one or more memories storing instructions executable on the one or more processors, the apparatus comprising:
    a spatial information setting processor configured to use, as data input from outside, modeling data regarding objects and spaces obtained through 3 dimensional modeling of the objects included in the spaces, relationship information regarding connection relationship between the objects, and property information regarding the objects to perform a function of setting spatial information for the modeling data regarding the spaces and the objects included in the spaces by setting shapes of the spaces formed by the objects, property information regarding the spaces, and connection information between the spaces;
    a video monitoring requesting processor configured to, when a selection for one piece of spatial information is received from a user terminal as a request for connection between spatial information and a video monitoring apparatus, select a video object corresponding to the video monitoring apparatus from among objects set to a key value identical to a key assigned to the one piece of spatial information and transmit a video streaming start requesting signal to the selected video object; and
    a video playback processor configured to, when video data is received from the video object that has received the video streaming start requesting signal from the video monitoring requesting processor, process the video data to be matched to a video playback protocol in a user interface of the user terminal executing a video streaming and transmit the processed video data to the user terminal.

2. The apparatus of claim 1, wherein:
    the video playback processor is configured to use different video connection methods according to a protocol of connection equipment connecting between the video monitoring apparatus corresponding to the video object and the video playback processor,
    when the protocol is HTTP, received video data is directly output to the user interface executed on the web,
    when the protocol is a protocol set for each video monitoring apparatus other than HTTP, a first intermediate player, which is installed between the video playback processor and the video object and a playback program dedicated for video data is executed thereon, is further provided, and the video playback processor is configured to perform a first method of transmitting video streaming data, which is operational on the user interface and generated as the first intermediate player plays back video data, to the user terminal to output the video streaming data on the user interface executed on the user terminal, and
    a second intermediate player, which is installed between the video playback processor and the video object and converts RTSP streaming to the form of a web socket, is further provided, and the video playback processor is configured to perform a second method of transmitting a video by opening a web socket port to the user terminal that attempts to connect through the user interface on the second intermediate player.

3. The apparatus of claim 1, wherein the spatial information setting processor comprises:
    a first spatial information setting unit configured to, when modeling data, which is data input from the outside for defining an outer shape of an object through 3-dimensional modeling of the object, is received, define first spatial information, which defines a shape of a space formed by at least one object, based on a shape of modeling;
    a connection information setting unit configured to set node data corresponding to a center point of each space by using the first spatial information and setting connection information comprising link data, which represents connection relationships between node data, by using input data, which is received from the outside and is related to connection relationships between node data;
    a second spatial information setting unit configured to set second spatial information that defines property information regarding a space formed by objects by using property information for the objects input from the outside; and
    a spatial information setting completing unit configured to link the first spatial information, the second spatial information, and the connection information for each space, thereby setting spatial information regarding modeling data of each space and each object included in each space.

4. The apparatus of claim 3, wherein the first spatial information comprises at least one of first detailed data defining a shape of each space in light-weighted data, second detailed data indicating whether each space relates to an indoor space or an outdoor space, and third detailed data for identifying a type of a space formed by objects based on modeling shapes of the objects.

5. The apparatus of claim 4, wherein, when the modeling data is received, the first spatial information setting unit is configured to generate light-weighted frame data for defining an outer shape of each space based on the modeling data, set regions of a space by using geometry drawn on a floor surface of the space formed by objects for each frame data, and, when the space formed by the objects is an indoor space, define a height of the space by using modeling data regarding the objects.

6. The apparatus of claim 3, wherein the second spatial information comprises:
    at least one of a name of a space, a purpose of the space, a type of the space, a geometry of one of the objects constituting the space, information for distinguishing whether the space is an indoor space or an outdoor space, drawing data regarding the space, or detailed architectural information regarding the space.

7. The apparatus of claim 3, wherein the spatial information setting completing unit is configured to automatically set spatial information including the key value regarding the video object as spatial information for a space to which the video object belongs.

8. The apparatus of claim 7, wherein, when the video object plays back through the user interface, the video playback processor is configured to extract spatial information having a key value identical to the key value of the video object and output the spatial information to the user interface and, when there is a history of a change of a video object that generated video data output to the user interface, output information regarding a change of history of spatial information, which is generated as the video object is changed, to the user interface.

9. The apparatus of claim 3, wherein, based on the modeling data, a center point of a floor surface of a space formed by objects is defined as node data regarding the space and the objects forming the space when the objects constitute an outer shape and an internal space of a building, centers of objects are defined as node data regarding the objects when the objects interconnect spaces, and points of intersection of link data interconnecting the node data are defined as node data regarding a path space interconnecting the spaces.

10. The apparatus of claim 1, wherein, when setting spatial information for the video object, the spatial information setting processor is configured to set spatial information by including connection information regarding a video monitoring apparatus corresponding to the video object from among information included in the property information regarding video monitoring apparatuses, which is input from the outside, in the spatial information regarding the video object as information for selecting the video object and requesting the selected video object to transmit video data.

* * * * *